United States Patent
Tsai

(10) Patent No.: US 6,275,042 B1
(45) Date of Patent: Aug. 14, 2001

(54) EQUIPMENT FOR TESTING BATTERY OF ELECTRIC DEVICE

(76) Inventor: Wei-Jen Tsai, No. 9, Lane 194, Chung Hsiao Road, South Area, Taichung (TW)

( * ) Notice: Subject to any disclaimer, the term of this patent is extended or adjusted under 35 U.S.C. 154(b) by 0 days.

(21) Appl. No.: 09/433,714

(22) Filed: Nov. 4, 1999

(30) Foreign Application Priority Data

Oct. 1, 1999 (TW) ................................................ 88216589

(51) Int. Cl.[7] ........................... H02J 7/04; G01N 27/416
(52) U.S. Cl. ........................ 324/427; 324/433; 320/132; 320/134; 320/136
(58) Field of Search .................................. 324/427, 433; 320/132, 134, 136

(56) References Cited

U.S. PATENT DOCUMENTS

| | | | |
|---|---|---|---|
| 4,433,294 | * 2/1984 | Windebank | 324/426 |
| 5,387,871 | * 2/1995 | Tsai | 324/429 |
| 6,127,807 | * 10/2000 | Tsai | 320/132 |

FOREIGN PATENT DOCUMENTS

03142038 * 5/1983 (DE) ..................................... 307/131

* cited by examiner

*Primary Examiner*—Peter S. Wong
*Assistant Examiner*—Gregory J. Toatley, Jr.
(74) *Attorney, Agent, or Firm*—Browdy and Neimark

(57) ABSTRACT

An equipment is designed to test the residual characteristic of a battery set of an electric device. The equipment comprises a microcomputer main unit, an analog/digital converter, a decoder, at least one set of voltage testing lines, at least one relay, an analog switch, and a display. The voltage testing lines are connected with each battery of the battery set for measuring the terminal voltage of each battery. The analog switch is used to measure the discharge current, which is transmitted along with the terminal voltage via the analog/digital converter to the microcomputer main unit. One of the relays is activated by the microcomputer main unit via the decoder to retrieve the terminal voltage datum of one of the batteries of the battery set for computing the value of a residual characteristic by the microcomputer main unit. The value of the residual characteristic of the battery is digitally exhibited by the display.

9 Claims, 2 Drawing Sheets

EQUIPMENT FOR TESTING BATTERY OF ELECTRIC DEVICE

FIELD OF THE INVENTION

The present invention relates generally to an equipment for testing the characteristics of a battery, and more particularly to the equipment for testing the characteristics of the battery serving as the power source of an electric device.

BACKGROUND OF THE INVENTION

The battery is an indispensable element of the generator and the electric motor vehicle. As the storage capacity of the battery deteriorates, the normal operations of the generator and the electric motor vehicle are adversely affected or even interrupted.

The battery set becomes an integral part of the operating system only after the battery set is initially charged such that the initial charge is followed by the discharge test, and that the discharge test is followed by the recharge. After a prolonged use of the battery, the storage capacity of the battery diminishes gradually due to the stripping off of the activated (effective) material or the hardening of the terminal plate. The reduction in the storage capacity of the battery results in an increase in the internal resistance of the battery. Such a circumstance as described above may happen to only one or two individual batteries of the whole set. In light of all batteries of the whole set being connected in series, one or two bad batteries can be the culprit of the reverse charge which transpires at the time when the battery set is discharged. As a result, the battery set is loaded and unable to furnish power. It is therefore imperative that the residual storage capacity and the residual characteristic of the battery set in operation must be monitored from time to time.

The conventional method for testing the battery storage capacity is based on the specific gravity measurement in place of the application of a dummy load to carry out the discharge experiment. The specific gravity measurement method can not be employed to test the storage capacity of those batteries which do not use water.

The inventor of the present invention has disclosed a method for testing the characteristics of a battery set. The method involves the use of a multiple loop voltage testing device by which the data of voltage and current of each individual battery of the battery set are collected and transmitted to a computer at the time when the battery set is charged and discharged. Upon completion of the charge testing and the discharge testing, the characteristics of the internal resistances of all batteries are computed by the computer on the basis of the terminal voltage of the batteries of the battery set. The internal resistance characteristics are then expressed by the curves. As a result, the comparison diagram of the characteristic curves is constructed. The characteristic of each battery of the battery set is judged by the interval between the two curves. This method is defective in design in that the comparison diagram contains numerous curves, which can cause a great deal of confusion unless the size scale is appropriately enlarged. In addition, this comparison approach is by no means revealing in view of the fact that it does not provide the residual capacity of each battery of the battery set in a quantitative term. In other words, this comparison approach serves to identify those batteries which are relatively poorer in characteristic. Moreover, the method is time-consuming such that the charge testing and the discharge testing take as long as 50 to 60 minutes.

SUMMARY OF THE INVENTION

It is therefore the primary objective of the present invention to provide an equipment for testing the characteristics of the battery set of an electric device such that the data of the residual capacity and the residual discharge time of each individual battery of the battery set are furnished for reaching a conclusion.

It is another objective of the present invention to provide a cost-effective and efficient equipment for testing the characteristics of the battery set serving as a power source of an electric device.

The objectives, features and advantages of the present invention will be more readily understood upon a thoughtful deliberation of the following detailed description of a preferred embodiment of the present invention with reference to the accompanying drawings.

DETAILED DESCRIPTION OF THE INVENTION

Figure 1:
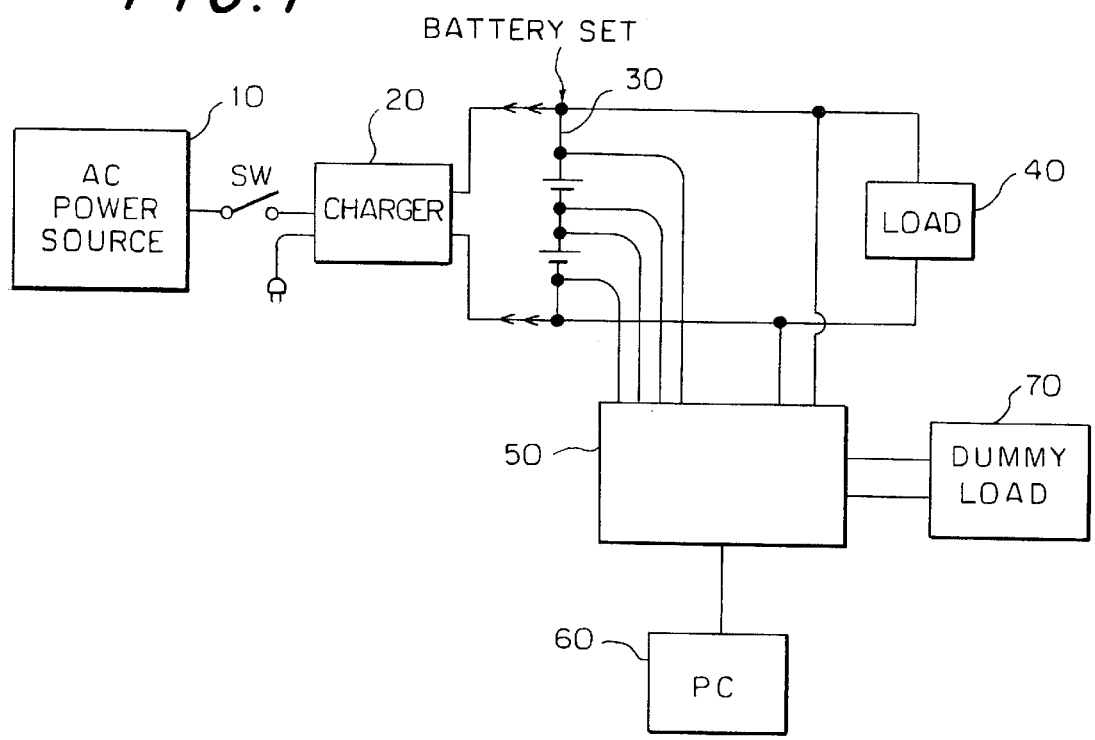
FIG. 1 shows a schematic layout of a battery testing system of the present invention.

As shown in FIG. 1, an alternating current power source 10 is connected to a charger 20 via a switch SW such that a direct current power source output is brought about, and the direct current power source is connected in a parallel manner with a battery set 30 before being connected with a load 40, which is the operating motor of the starting motor of a generator or electric motor vehicle. The normal operation of the load 40 is brought about by the direct current power source furnished by the battery set 30. It is therefore apparent that each battery of the battery set 30 must be regularly inspected and maintained so as to prevent the failure of the start of the generator or the breakdown of the electric motor vehicle.

The present invention makes use of a single loop or multiloop test equipment 50, which is connected with the positive terminal and the negative terminal of each battery of the battery set 30 for measuring the terminal voltage of each battery. When the load 40 is started, the stored energy is removed from the battery set 30 to the load 40. During the period of the discharge, the voltage value and the current value of each battery are automatically collected by the single loop or munltiloop test equipment 50 such that the residual capacity of the battery set is calculated. In addition, the test equipment 50 may be further connected with a dummy load 70, which is engaged in the periodic discharge and recharge for activating the battery in conjunction with the charger 20.

Figure 2:
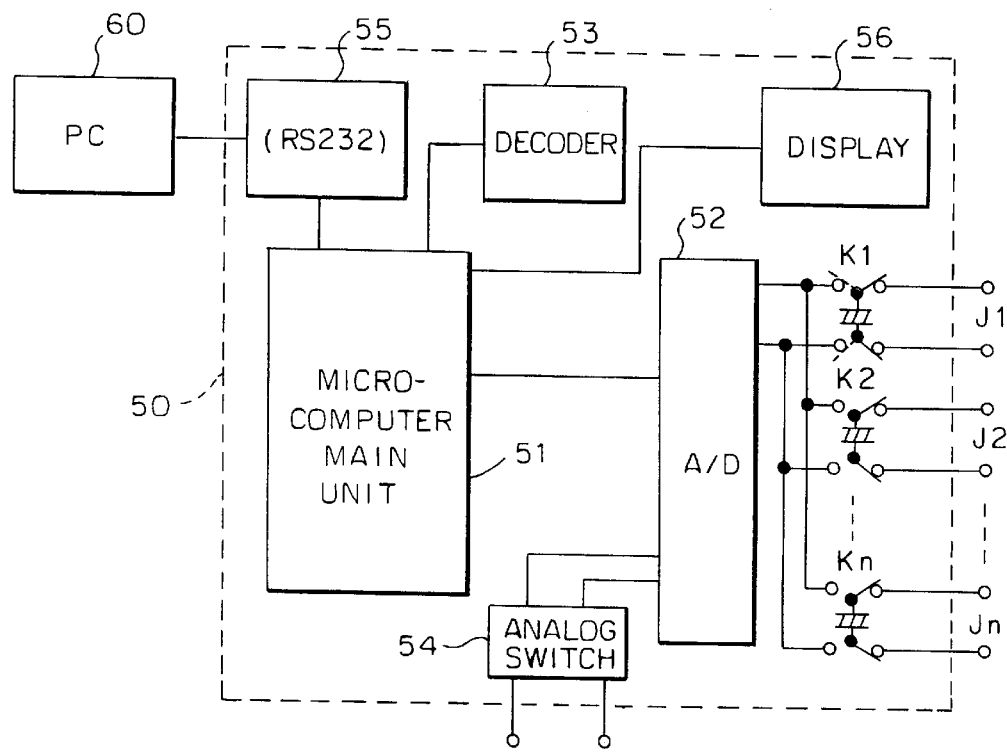
FIG. 2 shows a circuit layout of the present invention.

As shown in FIG. 2, the battery testing equipment 50 of the present invention comprises a microcomputer main unit 51, an analog/digital converter 52, a decoder 53, one or more relays K1 or Kn, one or more sets of voltage testing lines J1 or Jn, an analog switch 54, a RS232 serial communication 55, and a display 56. Each of the voltage testing lines Jn is connected with the positive terminal and the negative terminal of each battery of the battery set 30 for measuring the terminal voltage of each battery. The analog switch 54 is used to measure current and temperature. The data of the terminal voltage, current and temperature, which are measured by the voltage testing lines Jn and the analog switch 54, are transmitted to the microcomputer main unit 51 by the A/D converter 52 serving as a data-reading interface. One of the relays Kn is selected to operate by the microcomputer main unit 51 via the decoder 53 such that the retrieved voltage is sent to the microcomputer main unit 51 via the A/D converter 52. The residual storage capacity and the residual discharge time are calculated by the microcomputer main unit 51 and are then transmitted to a personal computer (PC) 60 via the RS232 serial communication 55. The data are processed by the PC 60 for the purpose of monitoring the battery.

The calculations of the residual storage capacity and the residual discharge time by the microcomputer main unit 51 are done at the time when the discharge takes place. The basic theory of the battery characteristics and the inference of the experimental data are explained hereinafter.

(1) The battery internal resistance (R) is about directly proportional to the value of drop in the battery terminal voltage (V) in light of the theoretical relationship between the battery internal resistance and the terminal voltage in the discharge process being as follows:

discharge current (I)×battery internal resistance (R)= battery chemical potential (E)–terminal voltage (V)

When the battery is in the state of floating charge, the chemical potential (E) of the battery may be regarded as a constant. In the meantime, the discharge current (I) is regarded as a specific value. For this reason, the battery internal resistance (R) is about directly proportional to the drop value of the terminal voltage (V). This implies that the battery internal resistance (R) becomes greater at such time when the drop value of the terminal voltage (V) becomes greater.

(2) The battery internal resistance (R) is about inversely proportional to the residual storage capacity (C). The experimental process exhibits that the residual storage capacity (C) becomes greater at the time of the battery discharge. In the meantime, the battery internal resistance (R) becomes smaller. On the contrary, the greater the battery internal resistance (R) is, the smaller the residual storage capacity (C) becomes.

(3) The drop value of the battery terminal voltage (V) is about inversely proportional to the residual storage capacity (C).

On the basis of the above inferences (1) and (2), which show the interrelationship among the battery internal resistance (R), the terminal voltage (V), and the residual storage capacity (C), it is readily apparent that the drop value of the battery terminal voltage (V) is inversely proportional to the residual storage capacity (C). The greater the residual storage capacity (C) is, the smaller the drop value of the terminal voltage (V) becomes.

(4) The current is about inversely proportional to the discharge rate (K). In light of the equation of the residual storage capacity (C)=discharge current (I)×discharge rate (K), the discharge rate (K) is directly proportional to the residual storage capacity (C) at the time when the discharge current (I) remains constant. According to the inference (3), the discharge rate (K) is inversely proportional to the drop value of the terminal voltage (V).

Figures 3, 4:
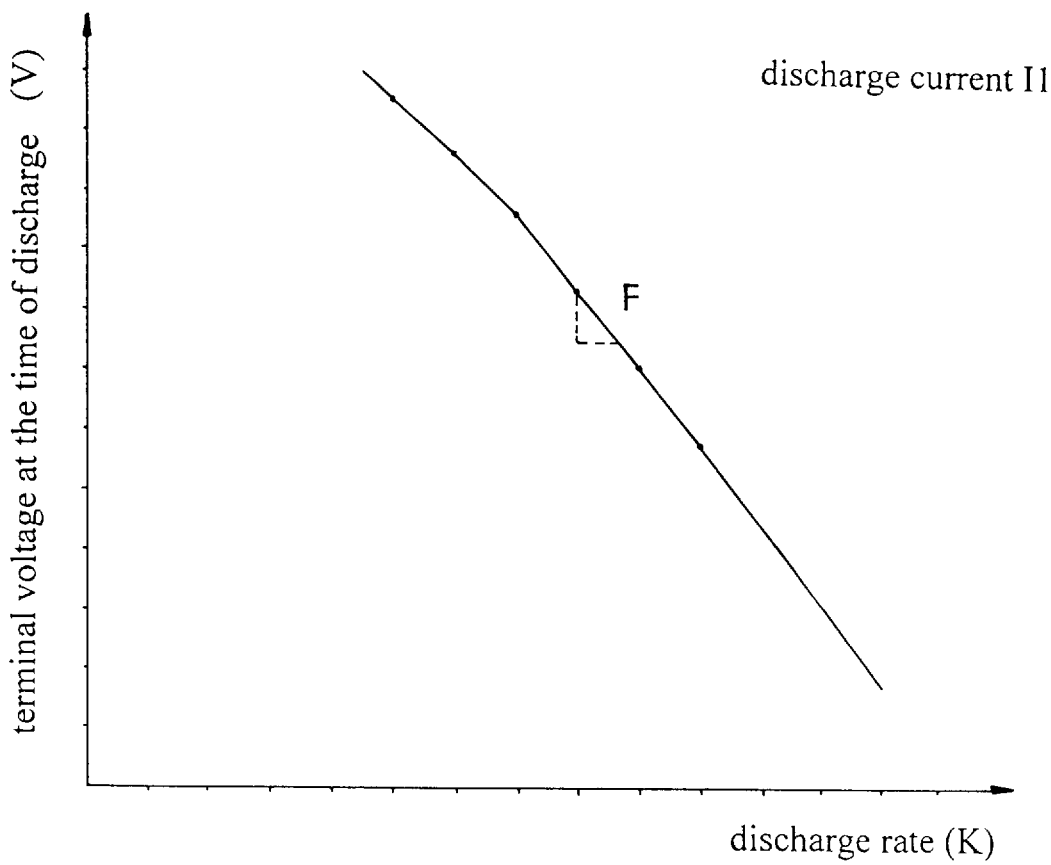
FIG. 3 is a diagram showing the relationship between the terminal voltage and the discharge rate of the present invention under the circumstance that the discharge current is I1.
FIG. 4 shows a schematic view of a display of the present invention at work.

In the course of the above inferences (1), (2), (3), and (4), it was boldly assumed that the relationship did exist between the drop value of the terminal voltage (V) and the discharge rate (K). Under the circumstance that a specific discharge current (I) is measurable, the terminal voltage (V) is measurable. In the meantime, the residual storage capacity (C) can not be known. As a result, the inference is made that the drop value of the battery terminal voltage (V) is about inversely proportional to the discharge rate (K). Under the circumstance of a specific current I1, an interactive coordinate of the terminal voltage (V) and the discharge rate (K) was made in the course of the discharge test that was carried out by this inventor of the present invention, as shown in FIG. 3. The line section is of a wave motion and doubly sectioned. Under the circumstance of the line section separation of the small section, the inverse relationship may be established such that the inverse ratio constant F may be obtained. Under the circumstance of various specific discharge currents I2, I3, I4 . . . of the present invention, the interactive relationship of the terminal voltage (V) and the discharge rate (K) is of a wave motion and is multisectional. In view of the line section separation of the small section, the inverse relationship between the terminal voltage (V) and the discharge rate (K) can be established. In various sections, the inverse ratio constant F may be obtained.

Under various specific discharge current (I), the relationship between the battery terminal voltage (V) and the discharge rate (K) in various small sections is expressed as follows;

$$\text{Battery terminal voltage}\,(V) = \frac{F(\text{ratio constant})}{K(\text{discharge rate})}$$

As a result, under various discharge conditions, the ratio constant F can be obtained from the experiment, the interpolation or the table comparison of the relationship between the battery terminal voltage $$(V) \text{ and } \frac{1}{K(\text{discharge rate})}.$$

The energy is removed from the battery set 30 to the load 40. In the meantime, the microcomputer main unit 51 retrieves the terminal voltage (V) from each voltage test line Jn, whereas the value of the discharge current (I) is retrieved from the analog switch 54. In the discharge process of this small section, the battery terminal voltage (V) and the discharge rate (K) are about in a predetermined inverse proportion (F) by which the discharge rate (K) is obtained. The residual storage capacity (C) is obtained by multiplying the discharge rate (K) by the measured discharge current (I). The residual discharge time is obtained by dividing the residual storage capacity (C) by the discharge current (I) of the power supply demand. For example, if the residual storage capacity is 60 AH, whereas the discharge current of the normal power supply demand is 20 A, the residual discharge time is 3 hours. The data of the residual discharge time are shown in the display 56. In the case of the electric motor vehicle, the residual range is obtained by the operation of the residual storage capacity (C), the load current, the revolving speed of motor, and the wheel radius. The display 56 is a liquid crystal display (LCD), light emitting diode (LED), or pointer, as shown in FIG. 4.

According to the present invention, the residual storage capacity (C) and the residual discharge time of each battery of the battery set are made available by the special theory and the inference based on the experiments. In other words, the residual storage capacity and the residual discharge time of the present invention are digitally expressed. In addition, the test of the present invention can be concluded in a short period of time, with the precision rate thereof being as high as 75–90%. The precision rate may be much higher if the temperature and other elements are factored into.

One of the advantages of the present invention is the fact that the residual storage capacity is expressed in digital form even though the precision rate of the present invention is not as high as 100%. The data obtained by the present invention are relatively reliable such that the judgement may be made of the deterioration of the battery set on the basis of data in place of the naked eyes by which the judgement is made of the variations of numerous curves. In addition, the present invention is cost-effective. The length of the testing time of the present invention is as short as 5 minutes.

The embodiment of the present invention described above is to be regarded in all respects as being merely illustrative and not restrictive. Accordingly, the present invention may be embodied in other specific forms without deviating from the spirit thereof. The present invention is therefore to be limited only by the scopes of the following appended claims.

What is claimed is:

1. An equipment for testing a battery set of an electric motor vehicle that has an electric motor and a plurality of wheels, at least one of the wheels being connected to be driven by the motor, said equipment being connected between the battery set and the electric motor and comprising a microcomputer main unit, an analog/digital converter, a decoder, at least one set of voltage testing lines, at least one relay, an analog switch, and a display; wherein said one set of voltage testing lines is connected with two terminals of a battery of the battery set for measuring a terminal voltage of the battery; wherein said analog switch is used to measure a discharge current of the battery; wherein said analog/digital converter is used to transmit said terminal voltage of the battery and said discharge current to said microcomputer main unit; wherein one of said relays is selected by said microcomputer main unit via said decoder to retrieve a terminal voltage datum of the battery of the battery set whereby said terminal voltage datum is used by said microcomputer main unit to compare and compute a residual characteristic value, which is exhibited by said display, wherein a residual range is obtained using a residual storage capacity, the discharge current, the motor rotation speed and the radius of the at least one of the wheels.

2. The equipment as defined in claim 1 further comprising a RS232 serial communication via which said microcomputer main unit transmits the measured data to a personal computer for processing the measured data.

3. The equipment as defined in claim 1 further comprising a charger for charging the batteries of the battery set.

4. The equipment as defined in claim 3 being connected with a dummy load in cooperation with said charger to charge and discharge the batteries periodically.

5. The equipment as defined in claim 1, wherein said display is an LCD (liquid crystal display) element.

6. The equipment as defined in claim 1, wherein said display is an LED (light-emitting diode) element.

7. The equipment as defined in claim 1, wherein said microcomputer main unit makes use of an inversely proportional relationship of a terminal voltage and a discharge rate in a small section of a discharge process whereby said relationship is used to compute said discharge rate which is then multiplied by a measured discharge current to obtain the value of a residual storage capacity.

8. The equipment as defined in claim 7, wherein said residual storage capacity value is divided by a discharge current of a power supply demand to obtain a residual discharge time.

9. The equipment as defined in claim 1, wherein said display exhibits the data in a digital manner.

* * * * *